US008913975B2

(12) United States Patent
Deforeit et al.

(10) Patent No.: US 8,913,975 B2
(45) Date of Patent: Dec. 16, 2014

(54) ADAPTIVE STEPPED GAIN AMPLIFIER SYSTEM AND METHOD

(71) Applicant: NXP B. V., Eindhoven (NL)

(72) Inventors: Fabien Laurent Michel Deforeit, Caen (FR); Sebastien Robert, Emieville (FR); Sebastien Amiot, Beuville (FR)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 13/965,408

(22) Filed: Aug. 13, 2013

(65) Prior Publication Data

US 2014/0065993 A1 Mar. 6, 2014

(30) Foreign Application Priority Data

Aug. 28, 2012 (EP) .................................... 12290284

(51) Int. Cl.
*H04B 17/02* (2006.01)
*H04B 1/10* (2006.01)
*H03G 3/30* (2006.01)
*H03G 1/00* (2006.01)

(52) U.S. Cl.
CPC ............... *H04B 1/10* (2013.01); *H03G 3/3068* (2013.01); *H03G 3/3078* (2013.01); *H03G 1/0005* (2013.01)
USPC ........ 455/136; 455/130; 455/138; 455/150.1; 455/185.1; 455/234.1

(58) Field of Classification Search
CPC ........ H03G 3/00; H03G 3/301; H03G 3/3068
USPC ........... 455/130, 134, 136, 138, 150.1, 178.1, 455/185.1, 226.2, 232.1, 234.1, 240.1, 455/245.1
See application file for complete search history.

(56) References Cited

U.S. PATENT DOCUMENTS 7,697,911 B2 * 4/2010 Lai et al. .................... 455/232.1
8,571,152 B1 * 10/2013 Chen et al. .................... 375/345
2007/0241821 A1 10/2007 Dally et al.
2010/0130153 A1 5/2010 Khoini-Poorfard et al.
2010/0231801 A1 9/2010 Lococo et al.

FOREIGN PATENT DOCUMENTS

EP 2 362 544 A1 8/2011
WO 00/31867 A1 6/2000
WO 01/56177 A1 8/2001
WO 2004/086638 A2 10/2004

OTHER PUBLICATIONS

Sansen, Willy; "Distortion in Elementary Transistor Circuits"; IEEE Transactions on Circuits and Systems—II: Analog and Digital Signal Processing, vol. 46, No. 2; 11 pages (Mar. 1999).
Extended European Search Report for appl. No. EP 12290284.4 (Feb. 5, 2013).

* cited by examiner

*Primary Examiner* — Tuan Pham

(57) ABSTRACT

An adaptive stepped gain amplifier, for example for use in broadband receivers, has a step size which is dynamically compensated (for each received frequency) to cope with step error caused by frequency dependence of the amplifier performance.

13 Claims, 7 Drawing Sheets

MEMORY
30

ADAPTIVE STEPPED GAIN AMPLIFIER SYSTEM AND METHOD

CROSS-REFERENCE TO RELATED APPLICATIONS

This application claims the priority under 35 U.S.C. §119 of European patent application no. 12290284.4, filed on Aug. 28, 2012, the contents of which are incorporated by reference herein.

This invention relates to variable gain amplifiers.

Broadband receivers such as silicon tuners for television reception usually have RF variable gain amplifiers, implementing an automatic gain control (AGC).

These are intended to keep an optimum Signal-to-Noise-Ratio for any spectrum load conditions of the input signal. Ideally these amplifiers must have a continuously variable gain in order to provide a constant amplitude output signal to the demodulator. However, the physical implementation of continuous AGCs generally leads to poor dynamic range performance.

Stepped AGC amplifier implementations provide, generally, less noise and distortion because the variable gain levels are implemented using switching components (resistors or reactive components) instead of relying on analogue transconductance changes.

However, the large step changes in gain can give rise to image flicker or audio noise. For this reason, so-called "gain step killer" systems have been developed which allow stepped AGC control but without the noise problems.

FIG. 1 shows a known gain step killer system, for example as disclosed in US 2010/0231801 and US 2010/0130153.

The system comprises a stepped gain amplifier 10, a mixer 12 for frequency down-converting the RF signal and a "gain step killer" unit 14. When used with a receiver, a demodulator will also be provided, not shown in FIG. 1.

The mixer can for example provide a translation in frequency from the RF frequency to an intermediate frequency.

The problem of the use of a stepped gain will now be explained in more detail. FIG. 2 shows the RF amplifier gain step, with a step increase in gain at a particular point in time.

FIG. 3 shows an IF amplifier gain counter-step followed by very small gain steps. The large gain step is in the opposite direction to the gain step in FIG. 2 and is followed by a series of smaller steps ramping back to the original level. This is the so-called "gain step killer" principle.

FIG. 4 shows the overall receiver gain with the RF amplifier response of FIG. 2 and the IF amplifier response of FIG. 3. This approach avoids sudden changes in power level, which can give rise to image flicker or audio noise.

However, the problem of this type of gain step killer system for broadband systems is that the gain steps of the RF amplifier are not perfectly matched by the gain step killer. A residual level step can occur creating reception issues at the demodulator side. This residual step error arises because the gain of an RF amplifier is not constant with frequency.

FIG. 5 shows a real RF amplifier gain step variation with frequency. The RF amplifier can be considered to have several different gain settings. FIG. 5 shows two different gain settings for an RF amplifier versus frequency. The depicted gain transfer functions correspond to two consecutive gain settings for the RF amplifier. The targeted gain step for these two consecutive gain settings of the RF amplifier is 3 dB.

However the real design has some imperfections (parasitic capacitance of the components and layout). Due to these imperfections the targeted gain step is not constant and can vary from 3 dB to only 1.5 dB over the frequency range as shown in FIG. 5.

Therefore, if receiving a wanted signal at the high end of the frequency range, then the RF amplifier gain step is 1.5 dB.

FIG. 6 shows a real receiver output level with gain step compensation errors.

The gain step of the IF amplifier can be assumed to be constant, because the IF frequency bandwidth is smaller than the RF frequency bandwidth. In this case, the RF gain step is not perfectly compensated by the IF gain step as shown in FIG. 6, and some errors appear. There is a step compensation error 20 (because the height of the RF gain step of FIG. 2 and the IF gain step of FIG. 3 are not the same). This leads to a residual step 22, so that the desired gain change has not been implemented. Thus, although the AGC has in theory implemented a 3 dB gain step, at the particular frequency the RF amplifier gain has not achieved the desired gain increase.

These errors mean that performance is degraded because the output signal of the receiver is no longer constant. The errors can also cause some uncorrected blocks in the demodulator.

The present invention aims to reduce or avoid these errors.

According to the invention, there is provided a system and method as defined in the independent claims.

According to a first aspect, there is provided an RF amplifier system, comprising:

a first amplifier having AGC control, controllable to provide one of a first set of gain steps as a target gain value;

a second amplifier controllable to provide one of a second set of gain steps;

a controller for controlling the gain of the first amplifier such that the amplifier system has a gain which varies on each side of the target gain value;

a measurement unit for measuring a signal strength at an output of the system at different gain settings of the first amplifier and at different RF frequencies; and a memory for storing gain setting values derived from the measurements taken by the measurement unit for a plurality of different RF frequencies.

The invention uses a stepped gain amplifier to enable high dynamic range and to enable high signal-to-noise ratio of reception when used in a receiver. Compensation for gain step errors is carried out later in the receiver chain with a second amplifier, which can be a so-called "gain step killer" system.

The second amplifier is used not only as a gain step killer system, but it is also used to compensate for frequency dependent errors in the gain applied by the AGC loop of the first amplifier. In this way, the step size (of the first amplifier) is dynamically compensated by the second amplifier.

The controller is preferably adapted to control the gain of the first amplifier during a channel changing time period. In this way, a set of measurements of actual gain (as determined by a signal strength measurement) are used to enable control of the gain applied by the second amplifier. These measurements are taken during channel change so that the measurements do not affect the signal provided to the user.

The controller preferably is adapted to control the gain of the second amplifier using the gain setting values stored in the memory during channel reception. This then provides compensation for step errors during channel reception.

The controller is preferably adapted to control the gain of the second amplifier to provide a gain step killer function during channel reception if AGC gain changes of the first amplifier are applied. Thus, the normal gain step killer function can be implemented by the second amplifier, in addition to the function of compensating for errors in the gain step applied by the first amplifier.

The first set of gain steps are preferably spaced further apart than the second set of gain steps. For example, the first set of gain steps are spaced further apart by more than 2 dB and the second set of gain steps are spaced apart by less than 0.5 dB The invention can be used in a broadband receiver comprising a channel tuner and the RF amplifier system of the invention. Gain setting values for a plurality of frequencies are then stored in the memory.

According to a second aspect, the invention provides a method of setting the gain of an RF amplifier system, comprising:

controlling a first amplifier having AGC control provide one of a first set of gain steps as a target gain value;

controlling the gain of the first amplifier to provide a series of gain steps such that the amplifier system has a gain which varies on each side of the target gain value;

measuring a signal strength at an output of the system at different gain settings of the first amplifier and at different RF frequencies thereby to derive measured gain steps;

storing the measured gain steps for different gain setting values derived from the measurements taken by the measurement unit (99) for a plurality of different RF frequencies;

controlling a gain of a second amplifier based on the stored gain steps of the first amplifier.

Examples of the invention will now be described in detail with reference to the accompanying drawings, in which.

The invention provides an adaptive stepped gain amplifier, for example for use in broadband receivers. The step size is dynamically compensated (for each received frequency) to cope with step error caused by frequency dependence of the amplifier performance.

Before explaining the system and method of the invention, some alternative possible approaches are explained, to provide a more complete understanding of the problem involved.

Figure 1:
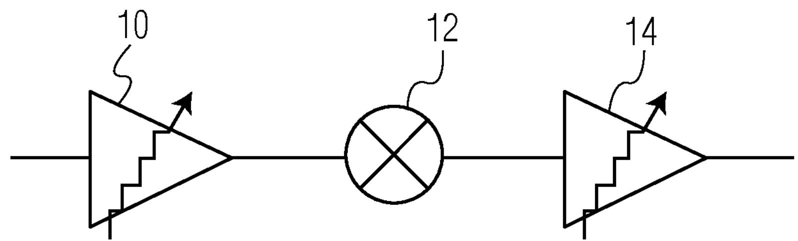
FIG. 1 shows a known gain step killer system.
Figure 7:
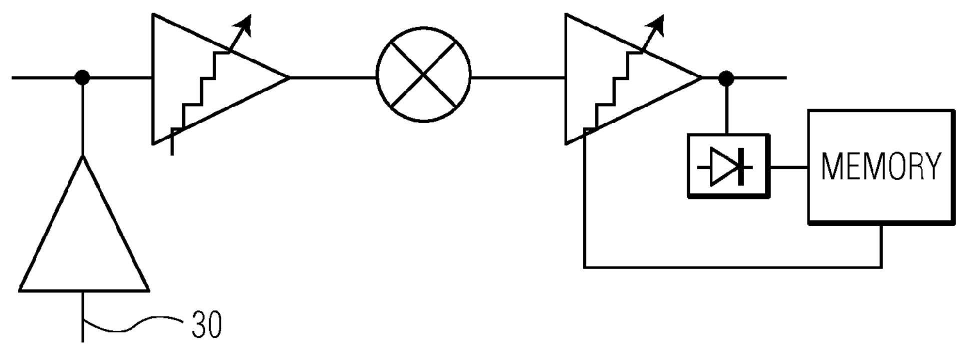
FIG. 7 shows the use of a calibration signal to correct the residual errors of gain step impairment between the RF and IF parts

To correct the residual errors of gain step impairment between the RF and IF parts, a calibration can be carried out, using a test calibration signal in the form of an embedded test tone. FIG. 7 shows such a calibration signal 30 routed to the input of the system of FIG. 1. The calibration signal is injected directly at the input, which is a problem in case of cable TV reception for example, because in case of cable reception it is not allowed to inject a signal in the cable. In this case a test tone cannot be injected directly at the antenna.

Figure 8:
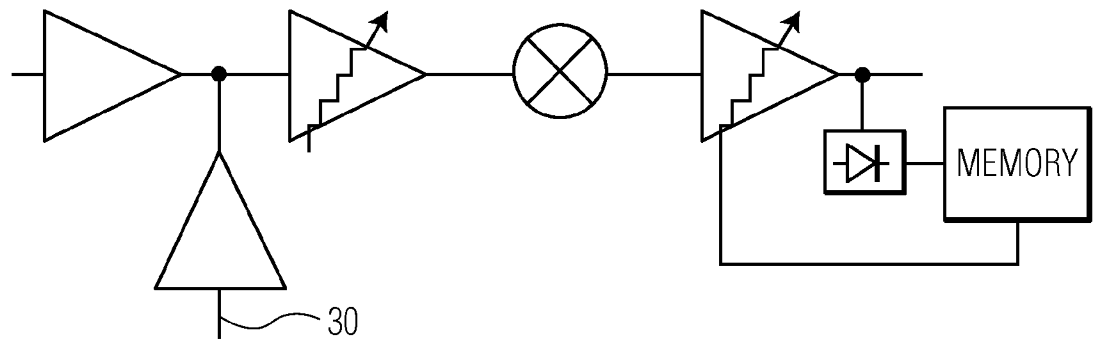
FIG. 8 shows the test tone used for calibration signal injected after amplification stage.

Alternatively, the test tone used for calibration signal 30 can be injected after a first amplification stage 32 as shown in FIG. 8. This amplification stage 32 cannot be calibrated so the use of a fixed gain amplifier is required.

Figure 9:
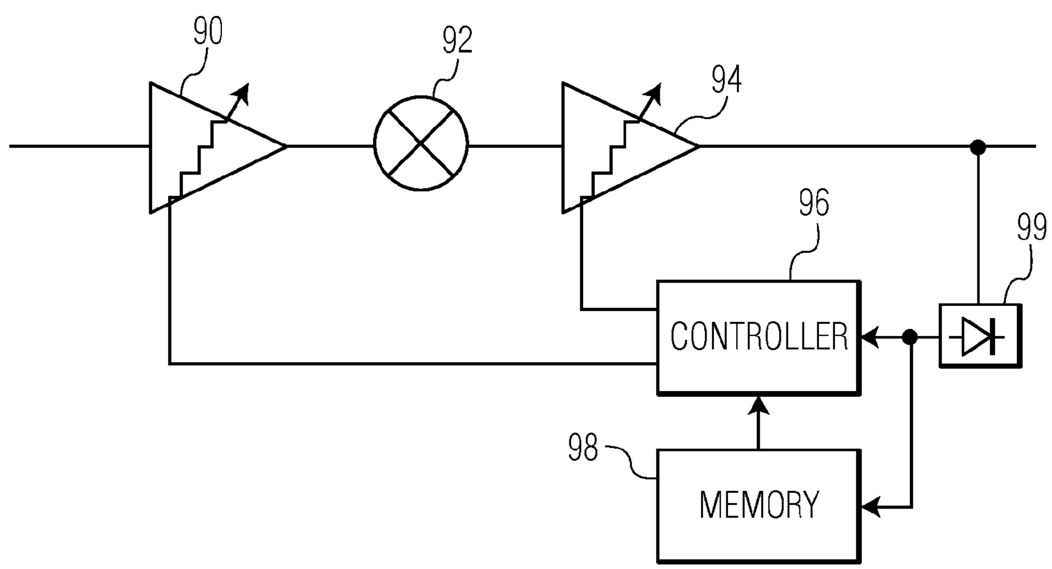
FIG. 9 shows in schematic form the system of the invention.

The invention relates to a calibration approach to overcome the problem of gain step compensation error and residual step error. It is desirable to avoid the use of a calibration signal injected at the input, since this is not possible in the case of cable TV reception, for example FIG. 9 shows in schematic form the system of the invention.

The system comprises an RF amplifier 90 which implements AGC, with gain steps. These gain steps have a first step size, for example 3 dB.

A mixer 92 translates to intermediate frequency. An IF amplifier system 94 compensates for the RF amplifier gain steps. The IF amplifier 94 can operate in the analog or digital domain (after Analog-to-Digital conversion).

The IF amplifier also applies gain steps, but with smaller step size, for example 0.2 dB for digital TV.

Thus, the gain setting of the IF amplifier can be used to fine tune the overall gain of the system, and this can be on a per-channel basis or for a group of channels present in the IF signal.

Figure 4:
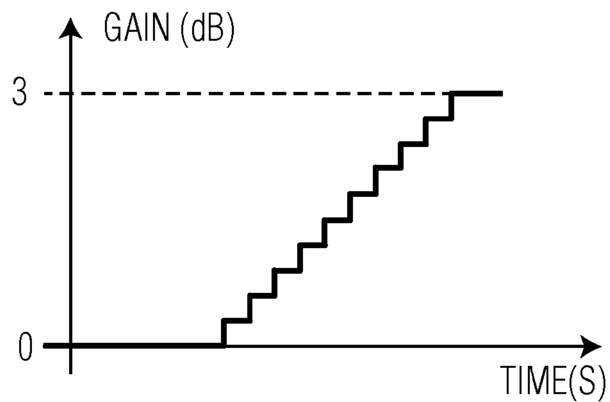
FIG. 4 shows the overall receiver gain with the RF amplifier response of FIG. 2 and the IF amplifier response of FIG. 3.

The IF amplifier is controlled by a controller 96 which can be in the form of a digital state machine including an algorithm to measure and store dynamically, in an embedded or external memory 98, the RF amplifier gain steps at channel/frequency selection and/or at initialization. The gain steps of the IF amplifier follow a ramp for example as shown in FIG. 4.

A signal strength indicator 99 is provided (although shown as a separate unit, this can be part of the controller 96), and is used to measure the impairments between the RF and IF domain.

The gain of the RF amplifier 90 is set by an AGC loop. It can for example comprise a wideband RF detector sensing the output of the amplifier 90 and a digital decoder which sets the gain of the amplifier 90.

The memory is used to store the exact value of the gain steps of the RF amplifier 90, for each channel (because the gain steps vary with frequency, thus are different from one channel to another).

Figure 6:
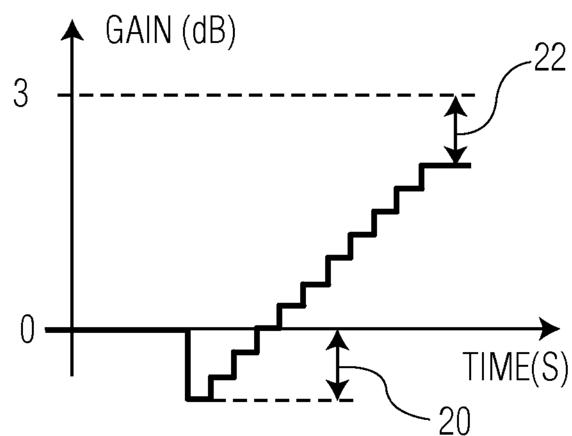
FIG. 6 shows a real receiver output level with gain step compensation errors.

The signal strength indicator 99 measures a power level, for example the RSSI. The system aims to optimise the residual gain step as shown in FIG. 6 by selecting the gain step that gives the optimum RSSI. The measurement of the RF amplifier gain steps follows a pattern as explained below with reference to FIGS. 10 and 11.

Thus, to determine the RF gain steps, the power of the output signal of the RF amplifier is measured. During a calibration phase, the controller 96 takes the control of the RF amplifier gain and the AGC loop is turned OFF, so that the gain steps can be measured. After the calibration phase the AGC loop is ON again.

Figure 5:
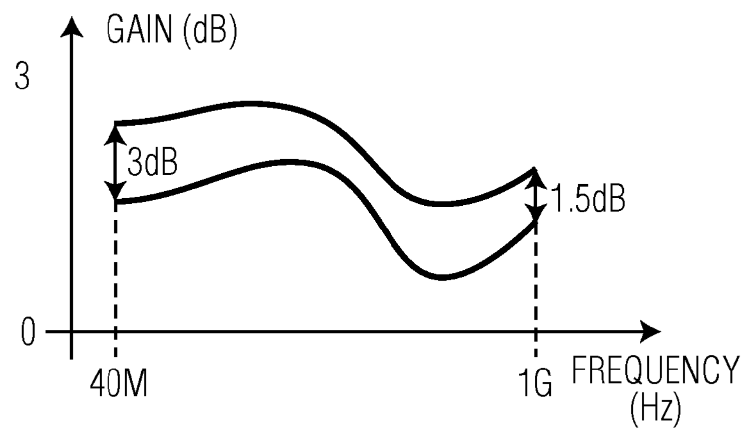
FIG. 5 shows a real RF amplifier gain step variation with frequency.
Figure 10:
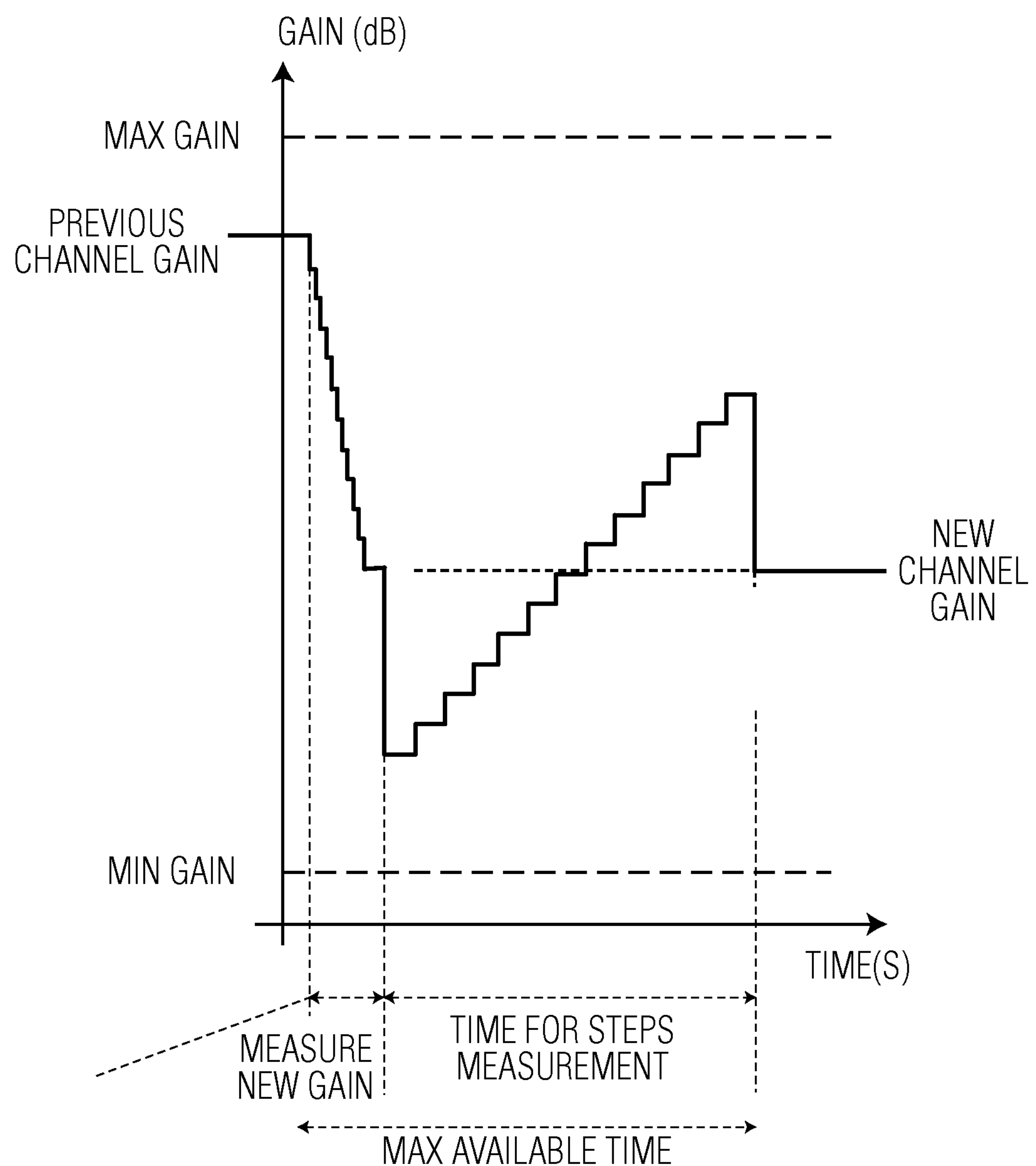
FIGS. 10 and 11 show the amplifier gain as a function of time for different target gain levels.
Figure 11:
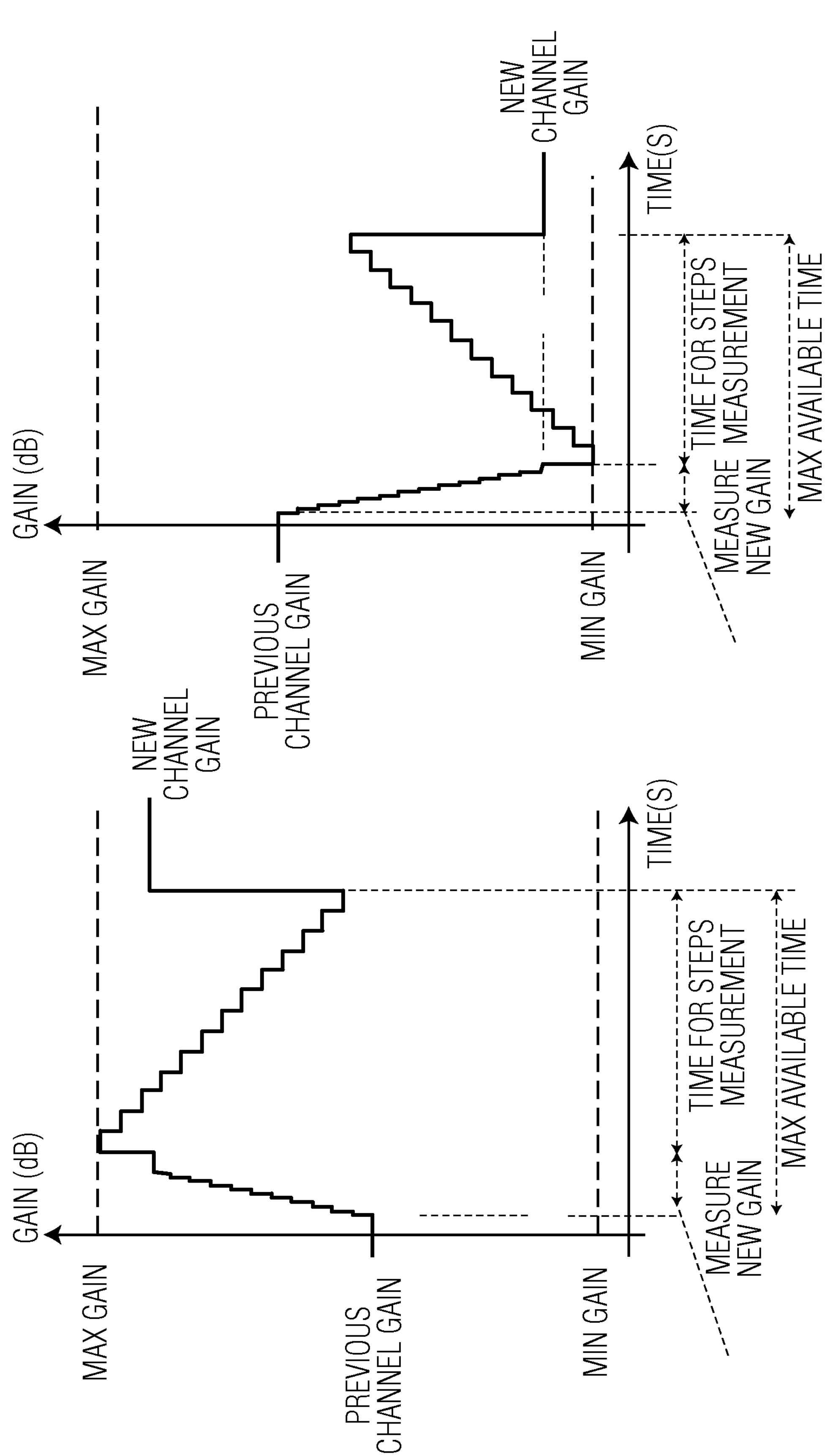

The stored gain steps can then be used by the IF amplifier to compensate accurately for the RF amplifier gain steps FIGS. 10 and 11 show the amplifier gain of the RF amplifier 90 as a function of time. The RF amplifier gain can vary from "Min gain" to "Max gain" with gain steps. These gain steps have some frequency variation as shown in FIG. 5.

Two different processes are shown in FIG. 10:

In response to a channel change, there is an initial time period "Measure new gain" which corresponds to the conventional gain change when a channel change occurs.

In the example of FIG. 10, the new gain is smaller than the previous one and there is a slope down from "previous channel gain" to "new channel gain". This is done automatically by the AGC loop.

The invention is implemented by forcing the gain of the RF amplifier at a set of values and measuring and storing the corresponding gain steps.

Thus, the gain steps shown in FIG. 10 are all the larger gain steps of RF amplifier, for example 3 dB.

The gain of the RF amplifier is forced around the final value "new channel gain". This measurement period includes a slope up in the gain curve from 6 steps below the final value to 6 steps above the final value.

The gain steps applied to the RF amplifier are fast enough to be included in the channel change procedure (which has a duration shown as "max available time" in FIG. 10) so that no perturbation is seen on the screen.

FIG. 11 shows the same approach but when the channel gain is increasing up to close to the maximum gain (left image) and when the channel gain is decreasing down to close to the minimum gain (right image). In these cases, it is not possible to provide an equal number of smaller gain steps above and below the new channel gain value because of the maximum and minimum levels.

During channel change, noise in the data is not an issue, so the control of the RF amplifier gain in this way is acceptable.

The RF gain steps are measured near the new channel selection gain settings for example in order to compensate for daily change. The stored gain steps are then used subsequently to compensate for the RF amplifier gain steps during reception.

The invention can be understood by considering three different time periods during TV reception. Note that TV reception is taken as an example of the invention, the concept of the invention can be extended to the reception of other standards, Initialization Large gain steps (3 dB for example) applied at the RF amplifier, and these are allowed because the demodulator is not yet ready to receive any signal.

Reception

During reception of a channel, the end user is looking at the TV and no perturbation is allowed to keep a high quality image and sound. In this case, only very small gain steps are acceptable (for example 0.2 dB). At the RF side of the receiver, it is difficult to implement 0.2 dB steps, and a 3 dB step amplifier is instead implemented. If the end user is looking at the TV for a very long time, some changes in the level of the received spectrum can be encountered (termed "daily change").

In this case the gain of the amplifiers in the receiver has to be change to keep a good noise/linearity tradeoff. However, large gain steps of 3 dB are to be avoided during reception of a channel to avoid image or noise degradation. 3 dB gain steps are implemented in the RF amplifier to keep a good noise/linearity tradeoff, and the large gain steps will be compensated by the 0.2 dB gain steps in the IF amplifier, so that the demodulator sees only 0.2 dB gain steps coming from the front end. This is the known gain step killer approach. However, the problem is that RF gain steps are not well controlled and can vary with frequency. Therefore by measuring and storing the gain steps of the RF amplifier for a given frequency, the IF amplifier can be controlled to provide a different gain step (2.5 dB or 3.8 dB for example instead of 3 dB).

In accordance with this invention, the gain steps of the RF amplifier are measured during channel change as shown in FIGS. 10 and 11.

Channel Change

Large gain steps (3 dB for example) are allowed because the demodulator is not yet ready to receive the new channel. This corresponds to a black screen on the TV set when changing from one channel to another. This transition phase is used by the system of the invention to measure the 3 dB gain steps of the RF amplifier as shown in FIGS. 10 and 11.

It is possible to measure only the gain steps between the previous and the new gain of the RF amplifier during the phase "measure new gain" in FIGS. 10 and 11. However, in order to store more gain steps, the algorithm measures some gain steps below and above the new gain value during the phase "time for steps measurement" in FIG. 10.

Once the gain steps are stored in the memory they can be used for accurate gain step compensation during reception.

The system thus uses the gain step killer unit to eliminate abrupt steps during normal channel reception as is known, but the size of the total gain step applied by the gain step killer system is then variable and dependent on the frequency dependency of the RF amplifier.

Figure 12:
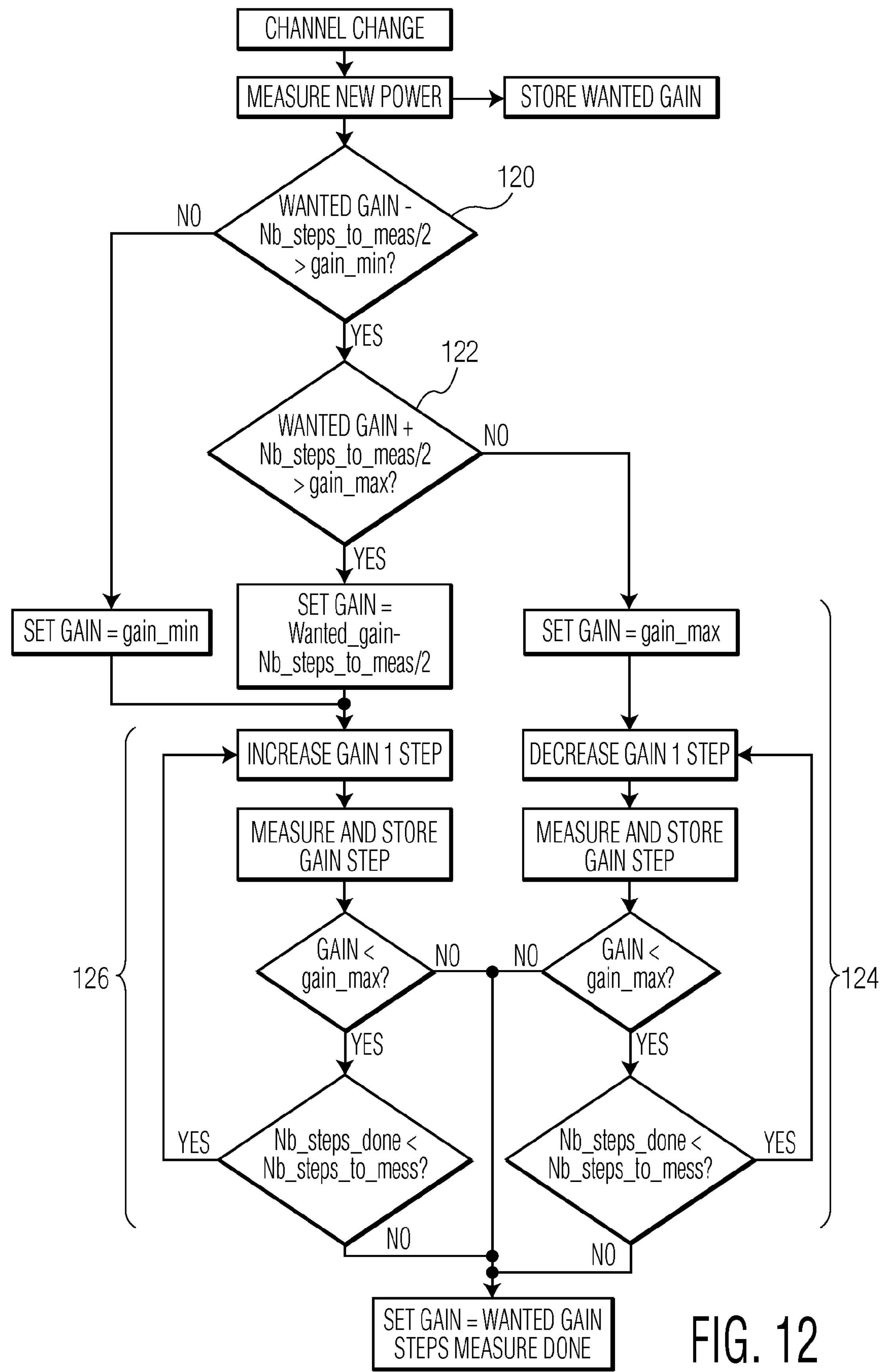
FIG. 12 shows an example of the control algorithm of the invention.

FIG. 12 shows an example of the control algorithm. In FIG. 12, the following definitions are used:

"Wanted gain" is the target new channel gain.

"Nb_steps_to_meas" is the maximum number of steps that can be carried out in the time available for measuring gain steps. It is the maximum time for steps measurement divided by the time to measure one step.

"Nb_steps_done" is the number of steps so far measured,

"gain_min" is the minimum gain.

"gain_max" is the maximum gain.

The algorithm essentially provides the operation shown in FIGS. 10 and 11. The two tests 120, 122 determined if there is room above and below the target gain level for half the number of steps. If there is, the algorithm implements gain control as in FIG. 10, and if there is not, it implements one of the gain control functions of FIG. 11.

Branch 124 decreases the gain in steps from the maximum gain until the required number of steps has been carried out (left part of FIG. 11).

Brach 126 increases the gain in steps from the minimum gain (right part of FIG. 11) or from the target gain less half the number of steps (FIG. 10) until the required number of steps has been carried out.

Thus, it can be seen that the system performs a measure of the gain step when a channel change is implemented. At the channel change, the gain of the RF amplifier will vary if the level of the new selected channel/frequency is different from the level of the previous channel. Then intermediate gain steps can be measured by the signal strength indicator (or digital AGC) and stored in the memory.

A Flash memory can for example be used to store multiple possible gain steps after several channel changes have taken place. The memory is in this way built up over time. The intermediate steps are measured near the new channel selection gain settings in order to compensate for daily change.

The RF amplifier is automatically programmed to the final gain thanks to the AGC loop and then is adjusted back and forth rapidly across the dynamic range of the RF amplifier gain to measure the gain step inaccuracy. The gain function has for a small period of time an overshoot in the gain setting which then comes back to the final setting.

As explained above, the stored gain steps are used subsequently to compensate for the RF amplifier gain steps during reception.

Depending on occurrence or probability of level change between two consecutive channel/frequency selections, the number of steps to be stored can be adapted to save memory capability.

Thus, in summary, the gain of the RF amplifier is measured during a channel change procedure. In FIGS. 10 and 11, it is considered that from "previous channel" to "new channel" the gain of the RF amplifier is changed because of a different power level between previous and new channels. The RF amplifier passes through several gain steps before reaching its targeted gain. The goal is to measure as many gain steps of the RF amplifier as possible and store the information in the memory so that it can be used at another channel change. In this case, the IF amplifier will be controlled by the system to avoid as much as possible the residual gain step as shown in FIG. 6.

Figure 2:
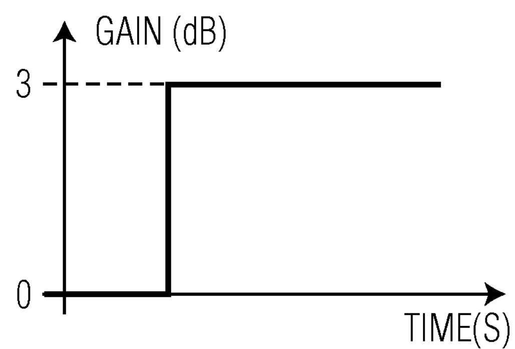
FIG. 2 shows the RF amplifier gain step, with a step increase in gain at a particular point in time.
Figure 3:
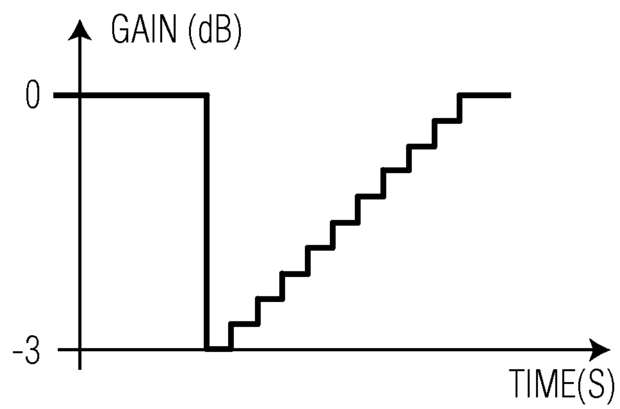
FIG. 3 shows an IF amplifier gain counter-step followed by very small gain steps.

FIGS. 10 and 11 show the gain of the RF amplifier only, rather than the gain of the whole system. The invention provides a suitable correction after the RF AGC. After the correction, the invention enables ideal gain variations to be provided as shown in FIGS. 2 to 4 for all channels to be received, thus for all the frequencies of interest. Ideally the invention aims to characterise all gains steps of the RF amplifier for each channel in a memory. In this way, for each RF amplifier gain step, and for each channel (thus for each frequency), the IF amplifier can compensate for the RF amplifier gain steps with a very good accuracy as shown in FIGS. 2 to 4, or at least with a very small residual step error as explained with reference to FIG. 6.

It will be apparent from the above description that the invention does not need any calibration signal generator. Calibration of the gain steps of the first amplifier is possible and the gain steps of the first amplifier are measured in real time.

The invention can be implemented in different ways depending on RF and IF partitioning.

Figure 13:
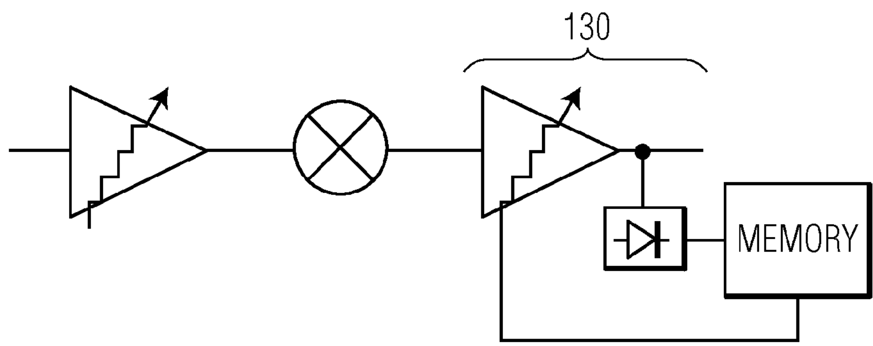
FIG. 13 shows an implementation used with IF analog gain step killer only.

FIG. 13 shows an implementation with an IF analog gain step killer 130. In FIG. 13, the compensation of the RF gain steps is made with an IF amplifier in the analog domain and using a signal strength indicator for measurement purposes. The controller is not shown, and this version corresponds to FIG. 9.

Figure 14:
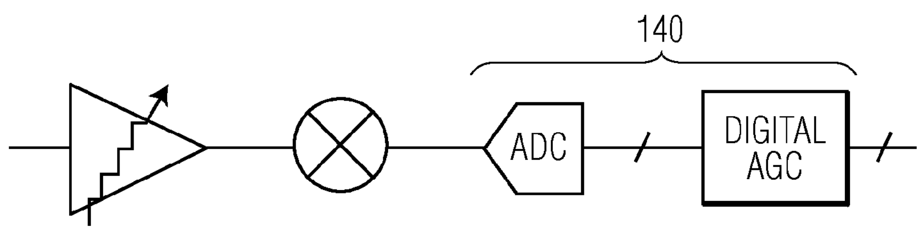
FIG. 14 shows an implementation used with an IF digital gain step killer only.

FIG. 14 shows an implementation with an IF digital gain step killer 140. The IF signal is sampled and digitized. The digital AGC implementation can be used for measurement and also the compensation for the gain step impairments.

Figure 15:
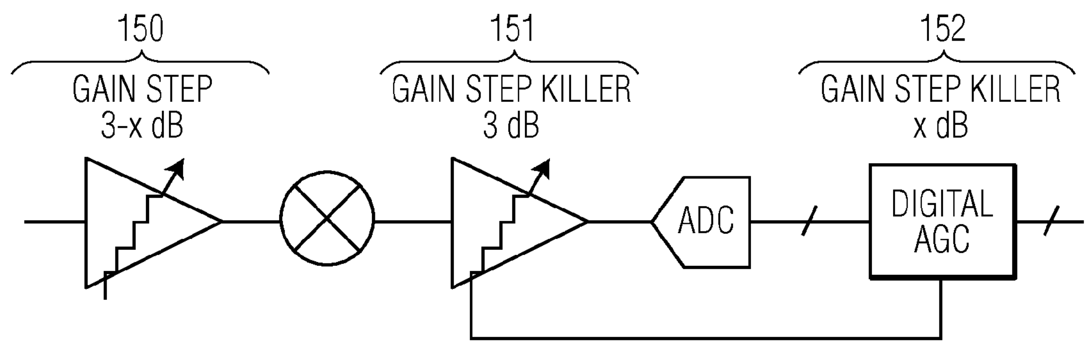
FIG. 15 shows an implementation with both IF analog and digital gain step killer.

FIG. 15 shows an implementation with both IF analog and digital gain step killer. This has compensation in the analog domain.

In this application of the invention, the gain step compensation is performed by both analog and digital AGCs. The RF amplifier is shown as 150. The Analog AGC 151 is considered to be fixed with 3 dB compensation in conventional manner. The digital AGC 152 is used to compensate for errors in the gain steps of the RF amplifier 150. If the gain step of the RF amplifier 150 is not 3 dB as targeted but only (3−x) dB as shown, then the analog amplifier will implement a 3 dB gain step, and the digital amplifier will implement an "x dB" gain step. The very small steps can be implemented in the analog amplifier or in the digital amplifier. Implementation in the digital amplifier 152 is preferred as it is easier to implement small steps in the digital domain than in analog domain.

The invention can be applied in multiple stream receivers. In such cases, the RF amplification covers a full spectrum comprising distinct channels or frequencies.

Figure 16:
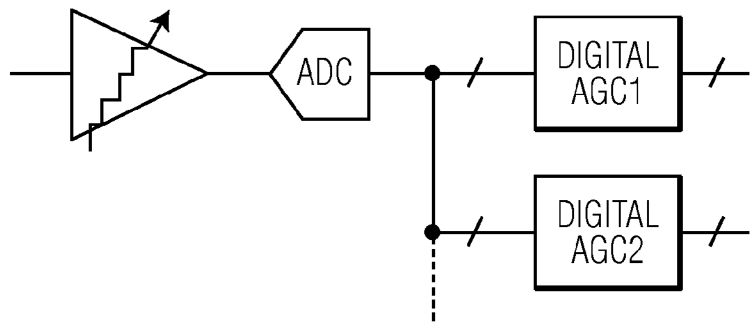
FIG. 16 shows how the invention can be used with a wide band full spectrum receiver.

FIG. 16 shows how the invention can be used with a wide band full spectrum receiver. This is a "Software Radio" implementation with multiple channel reception realised in the digital domain where AGC1 and AGC2 compensate for the gain step inaccuracy of the RF amplifier allowing compensation of different values of steps due to frequency dependence.

Various other modifications will be apparent to those skilled in the art.

The invention claimed is:

1. An RF amplifier system, comprising:
- a first amplifier having AGC control, controllable to provide one of a first set of gain steps as a target gain value;
- a second amplifier controllable to provide one of a second set of gain steps;
- a controller for controlling the gain of the first amplifier such that the amplifier system has a gain which varies on each side of the target gain value;
- a measurement unit for measuring a signal strength at an output of the system at different gain settings of the first amplifier and at different RF frequencies; and
- a memory for storing gain setting values derived from the measurements taken by the measurement unit for a plurality of different RF frequencies,
- wherein the controller is adapted to control the gain of the second amplifier to provide a gain step killer function during channel reception if AGC gain changes of the first amplifier are applied.

2. A system as claimed in claim 1, wherein the controller is adapted to control the gain of the first amplifier during a channel changing time period.

3. A system as claimed in claim 1, wherein the controller is adapted to control the gain of the second amplifier using the gain setting values stored in the memory during channel reception.

4. A system as claimed in claim 1, wherein the first set of gain steps are spaced further apart than the second set of gain steps.

5. A system as claimed in claim 1, wherein the first set of gain steps are spaced further apart by more than 2 dB and the second set of gain steps are spaced apart by less than 0.5 dB.

6. A broadband receiver comprising a channel tuner and an RF amplifier system as claimed in claim 1.

7. A receiver as claimed in claim 6, wherein gain setting values for a plurality of channels are stored in the memory.

8. A method of setting the gain of an RF amplifier system, comprising:
- controlling a first amplifier having AGC control to provide one of a first set of gain steps as a target gain value;
- controlling the gain of the first amplifier to provide a series of gain steps such that the amplifier system has a gain which varies on each side of the target gain value;
- measuring a signal strength at an output of the system at different gain settings of the first amplifier and at different RF frequencies thereby to derive measured gain steps;
- storing the measured gain steps for different gain setting values derived from the measurements taken by the measurement unit for a plurality of different RF frequencies;
- controlling a gain of a second amplifier based on the stored gain steps of the first amplifier; and
- controlling the gain of the second amplifier to provide a gain step killer function during channel reception if AGC gain changes of the first amplifier are applied.

9. A method as claimed in claim 8, comprising controlling the gain of the first amplifier during a channel changing time period.

10. A method as claimed in claim 8, comprising controlling the gain of the second amplifier using the gain setting values stored in the memory during channel reception.

11. A method as claimed in claim 8, wherein the first set of gain steps are spaced further apart than the second set of gain steps.

12. A method as claimed in claim 8, wherein the first set of gain steps are spaced further apart by more than 2 dB and the second set of gain steps are spaced apart by less than 0.5 dB.

13. A method as claimed in claim 8, for setting the gain of an RF amplifier of an RF receiver.

* * * * *